United States Patent
LaBrake (10) Patent No.: US 7,256,131 B2
(45) Date of Patent: Aug. 14, 2007

(54) METHOD OF CONTROLLING THE CRITICAL DIMENSION OF STRUCTURES FORMED ON A SUBSTRATE

(75) Inventor: Dwayne L. LaBrake, Cedar Park, TX (US)

(73) Assignee: Molecular Imprints, Inc., Austin, TX (US)

(*) Notice: Subject to any disclaimer, the term of this patent is extended or adjusted under 35 U.S.C. 154(b) by 0 days.

(21) Appl. No.: 11/184,664

(22) Filed: Jul. 19, 2005

(65) Prior Publication Data

US 2007/0017899 A1    Jan. 25, 2007

(51) Int. Cl.
*H01L 22/302* (2006.01)

(52) U.S. Cl. .................. 438/710; 438/637; 438/690; 216/56

(58) Field of Classification Search ................ 438/586, 438/690, 710, 637; 977/887, 888; 428/710
See application file for complete search history.

(56) References Cited

U.S. PATENT DOCUMENTS

| | | | |
|---|---|---|---|
| 4,426,247 A | 1/1984 | Tamamura et al. | |
| 4,507,331 A | 3/1985 | Hiraoka | |
| 4,512,848 A | 4/1985 | Deckman et al. | |
| 4,657,845 A | 4/1987 | Frchet et al. | |
| 4,692,205 A | 9/1987 | Sachdev et al. | |
| 4,731,155 A | 3/1988 | Napoli et al. | |
| 4,891,303 A | 1/1990 | Garza et al. | |
| 4,931,351 A | 6/1990 | McColgin et al. | |
| 4,959,252 A | 9/1990 | Bonnebat et al. | |
| 4,976,818 A | 12/1990 | Hashimoto et al. | |
| 5,028,366 A | 7/1991 | Harakal et al. | |
| 5,071,694 A | 12/1991 | Uekita et al. | |
| 5,110,514 A | 5/1992 | Soane | |
| 5,132,766 A * | 7/1992 | Tihanyi et al. | 257/144 |
| 5,162,248 A * | 11/1992 | Dennison et al. | 438/396 |

(Continued)

FOREIGN PATENT DOCUMENTS

JP    02-24848    1/1990

(Continued)

OTHER PUBLICATIONS

Wolf; Silicon Processing for the VLSI Era; vol. 1; Process Technology; p. 546-547, 1986 Latice Press; ISBN 0-9616721-3-7.*

(Continued)

*Primary Examiner*—Duy-Vu N. Deo
*Assistant Examiner*—Patricia A George
(74) *Attorney, Agent, or Firm*—Michael D. Carter; Fish & Richardson P.C.

(57) ABSTRACT

The present invention provides a method of patterning a substrate, the method including, inter alia, forming a multi-layered structure on the substrate formed from first, second and third materials. The first, second and third materials are exposed to an etch chemistry, with the first and second materials having a common etch rate along a first direction, defining a first etch rate, and the first and third materials having a similar etch rate along a second direction, transversely extending to the first direction, defining a second etch rate. Typically, the etch rate is selected to be different in furtherance of facilitating control of the dimensions of features formed during the etching process.

23 Claims, 4 Drawing Sheets

U.S. PATENT DOCUMENTS

| | | | |
|---|---|---|---|
| 5,173,393 A | 12/1992 | Sezi et al. |
| 5,198,326 A | 3/1993 | Hashimoto et al. |
| 5,234,793 A | 8/1993 | Sebald et al. |
| 5,240,550 A | 8/1993 | Boehnke et al. |
| 5,259,926 A | 11/1993 | Kuwabara et al. |
| 5,314,772 A | 5/1994 | Kozicki et al. |
| 5,425,848 A | 6/1995 | Haisma et al. |
| 5,434,107 A | 7/1995 | Paranjpe |
| 5,480,047 A | 1/1996 | Tanigawa et al. |
| 5,545,367 A | 8/1996 | Bae et al. |
| 5,597,438 A | 1/1997 | Grewal et al. |
| 5,601,641 A | 2/1997 | Stephens |
| 5,669,303 A | 9/1997 | Maracas et al. |
| 5,700,626 A | 12/1997 | Lee et al. |
| 5,743,998 A | 4/1998 | Park |
| 5,772,905 A | 6/1998 | Chou |
| 5,849,209 A | 12/1998 | Kindt-Larsen et al. |
| 5,849,222 A | 12/1998 | Jen et al. |
| 5,888,650 A | 3/1999 | Calhoun et al. |
| 5,905,104 A | 5/1999 | Eklund et al. |
| 5,907,782 A | 5/1999 | Wu |
| 5,954,997 A * | 9/1999 | Kaufman et al. .......... 252/79.1 |
| 5,962,191 A | 10/1999 | Nozaki et al. |
| 6,033,977 A | 3/2000 | Gutsche et al. |
| 6,046,056 A | 4/2000 | Parce et al. |
| 6,071,372 A | 6/2000 | Ye et al. |
| 6,074,827 A | 6/2000 | Nelson et al. |
| 6,096,655 A | 8/2000 | Lee et al. |
| 6,150,190 A | 11/2000 | Stankus et al. |
| 6,232,175 B1 | 5/2001 | Liu et al. |
| 6,245,581 B1 | 6/2001 | Bonser et al. |
| 6,309,580 B1 | 10/2001 | Chou |
| 6,326,627 B1 | 12/2001 | Putvinski et al. |
| 6,329,256 B1 | 12/2001 | Ibok |
| 6,334,960 B1 | 1/2002 | Willson et al. |
| 6,342,097 B1 | 1/2002 | Terry et al. |
| 6,387,787 B1 | 5/2002 | Mancini et al. |
| 6,391,217 B2 | 5/2002 | Schaffer et al. |
| 6,426,288 B1 | 7/2002 | Meikle |
| 6,455,411 B1 | 9/2002 | Jiang et al. |
| 6,468,853 B1 | 10/2002 | Balasubramanian et al. |
| 6,468,896 B2 | 10/2002 | Rohr et al. |
| 6,482,742 B1 | 11/2002 | Chou |
| 6,495,430 B1 | 12/2002 | Tsai et al. |
| 6,517,977 B2 | 2/2003 | Resnick et al. |
| 6,517,995 B1 | 2/2003 | Jacobson et al. |
| 6,518,189 B1 | 2/2003 | Chou |
| 6,566,258 B1 | 5/2003 | Dixit et al. |
| 6,580,172 B2 | 6/2003 | Mancini et al. |
| 6,646,662 B1 | 11/2003 | Nebashi et al. |
| 6,686,271 B2 | 2/2004 | Raaijmakers et al. |
| 6,696,220 B2 | 2/2004 | Bailey et al. |
| 6,703,190 B2 | 3/2004 | Elian et al. |
| 6,713,238 B1 | 3/2004 | Chou et al. |
| 6,716,767 B2 | 4/2004 | Shih et al. |
| 6,719,915 B2 | 4/2004 | Willson et al. |
| 6,730,256 B1 | 5/2004 | Bloomstein et al. |
| 6,737,202 B2 | 5/2004 | Gehoski et al. |
| 6,743,713 B2 | 6/2004 | Mukher-Hee-Roy et al. |
| 6,759,325 B2 | 7/2004 | Raaijmakers et al. |
| 6,767,983 B1 | 7/2004 | Fujiyama et al. |
| 6,776,094 B1 | 8/2004 | Whitesides et al. |
| 6,777,170 B1 | 8/2004 | Bloomstein et al. |
| 6,809,356 B2 | 10/2004 | Chou |
| 6,814,879 B2 | 11/2004 | Shibata |
| 6,820,677 B2 | 11/2004 | Grinberg et al. |
| 6,828,244 B2 | 12/2004 | Chou |
| 6,900,881 B2 | 5/2005 | Sreenivasan et al. |
| 6,908,861 B2 | 6/2005 | Sreenivasan et al. |
| 2002/0042027 A1 | 4/2002 | Chou et al. |
| 2002/0132482 A1 | 9/2002 | Chou |
| 2002/0167117 A1 | 11/2002 | Chou |
| 2002/0177319 A1 | 11/2002 | Chou |
| 2003/0034329 A1 | 2/2003 | Chou |
| 2003/0080471 A1 | 5/2003 | Chou |
| 2003/0080472 A1 | 5/2003 | Chou |
| 2004/0007799 A1 | 1/2004 | Choi et al. |
| 2004/0021254 A1 | 2/2004 | Sreenivasan et al. |
| 2004/0021866 A1 | 2/2004 | Watts et al. |
| 2004/0022888 A1 | 2/2004 | Sreenivasan et al. |
| 2004/0029041 A1 | 2/2004 | Shih et al. |
| 2004/0029372 A1 * | 2/2004 | Jang et al. .................. 438/586 |
| 2004/0036201 A1 | 2/2004 | Chou et al. |
| 2004/0046288 A1 | 3/2004 | Chou |
| 2004/0110856 A1 | 6/2004 | Young et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0156108 A1 | 8/2004 | Chou et al. |
| 2004/0188381 A1 | 9/2004 | Sreenivasan |
| 2004/0192041 A1 | 9/2004 | Jeong et al. |
| 2004/0197843 A1 | 10/2004 | Chou et al. |
| 2004/0211754 A1 | 10/2004 | Sreenivasan |
| 2004/0250945 A1 | 12/2004 | Zheng et al. |
| 2005/0037143 A1 | 2/2005 | Chou et al. |

FOREIGN PATENT DOCUMENTS

| | | |
|---|---|---|
| JP | 02-92603 | 4/1990 |
| WO | WO 99/05724 | 2/1999 |
| WO | WO 00/21689 | 4/2000 |
| WO | WO 01/47003 | 6/2001 |
| WO | WO 2005/031299 | 4/2005 |
| WO | WO 2005/031855 | 4/2005 |

OTHER PUBLICATIONS

Johnson et al., Advances in Step and Flash Imprint Lithography, SPIE Microlithography Conference Feb. 23, 2003.

Chou et al., Lithographically Induced Self-assembly of Periodic Polymer Micropillar Arrays, J. Vac. Sci. Technol. B 17 (6), pp. 3197-3202 Nov. 1, 1999.

Colburn et al., Step and Flash Imprint Lithography: A New Approach to High-Resolution Patterning, Proc. Of SPIE, vol. 3676 Mar. 1, 1999.

Chou, Nanoimprint Lithography and Lithographically Induced Self-Assembly, MRS Bulletin, pp. 512-517 Jul. 1, 2001.

Choi et al., Design of Orientation Stages for Step and Flash Imprint Lithography, Precision Engineering, pp. 192-199 Jan. 1, 2001.

Chou et al., Imprint Lithography with Sub-10 nm Feature Size and High Throughput, Microelectric Engineering 35, pp. 237-240 Jan. 1, 1997.

Haisma et al., Mold-assisted Nanolithography: A Process for Reliable Pattern Replication, J. Vac. Sci. Technol. B, pp. 4124-4128 Nov. 1, 1996.

Chou et al., Imprint of Sub-25 nm Vias and Trenches in Polymers, Appl. Phys. Lett. 67 (21) Nov. 20, 1995.

Colburn et al., Step and Flash Imprint Lithography for sub-100 nm Patterning, Proceedings of SPIE vol. 3997, pp. 453-457 Jan. 1, 2000.

Chou et al., Imprint Lithography with 25-Nanometer Resolution, Science vol. 272, pp. 85-87 Apr. 5, 1996.

Heidari, Nanoimprint Lithography at the 6 in. Wafer Scale, J. Vac. Sci. Technol. B 18(6), pp. 3557-3560 Nov. 1, 2000.

Translation of Japanese Patent 02-92603, Apr. 3, 1990.

Translation of Japanese Patent 02-24848, Jan. 26, 1990.

Chou et al., Ultrafast and Direct Imprint of Nanostructures in Silicon, Nature, Col. 417, (Jun. 2002), pp. 835-837 Jun. 1, 2002.

Chou et al., Nanoimprint Lithography, Journal of Vacuum Science Technologoy B 14(16), pp. 4129-4133 Nov. 1, 1996.

Colburn et al., Development and Advantages of Step-and-Flash Lithography, Solid State Technology Jul. 1, 2001.

Colburn et al., Characterization and Modeling of Volumetric and Mechanical Properties for Step and Flash Imprint Lithography Photopolymers, Journal of Vacuum Science Technology, vol. b. 19(6) Nov. 1, 2001.

Bailey et al., Step and Flash Imprint Lithography: Defect Analysis, Journal of Vacuum Science, B 19(6), pp. 2806-2810 Nov. 1, 2001.

Bailey et al., Step and Flash Imprint Lithography: Template Surface Treatment and Defect Analysis, Journal of Vacuum Science, B 18(6), pp. 3572-3577 Nov. 1, 2000.

U.S. Appl. No. 10/843,194, naming Inventors Sreenivasan et al., entitled A Method of Patterning a Conductive Layer on a Substrate, filed May 11, 2004.

U.S. Appl. No. 10/946,565, naming Inventors Vidusek et al., entitled Method of Forming an In-Situ Recessed Structure, filed Sep. 21, 2004.

U.S. Appl. No. 10/946,159, naming Inventors Miller et al., entitled Patterning Surfaces While Providing Greater Control of Recess Anistrophy, filed Sep. 21, 2004.

U.S. Appl. No. 10/946,577, naming Inventors Sreenivasan et al., entitled Reverse Tone Patterning on Surfaces Having Surface Planarity Pertubations, filed Sep. 21, 2004.

U.S. Appl. No. 10/946,566, naming Inventors Sreenivasan et al., entitled Pattern Reversal Employing Thick Residual Layers, filed Sep. 21, 2004.

U.S. Appl. No. 10/946,570, naming Inventors Sreenivasan, entitled Method fo Forming a Recessed Structure Employing a Reverse Tone Process, filed Sep. 21, 2004.

U.S. Appl. No. 10/946,574, naming Inventors Stacey et al., entitled Patterning Substrates Employing Multi-Film Layers Defining Etch-Differential Interfaces, filed Sep. 21, 2004.

Schneider et al., Striped of Partially Fluorinated Alkyl Chains: Dipolar Langmuir Monolayers, no date indicated.

Data Sheet for MAK (Methyl n-Amyl Ketone), www.sp-chem.com/fine_e Jan. 1, 2003.

Data Sheet for gamma-Glycidoxypropyltrimethoxysilane, www.powerchemical.net/3100.htm Dec. 5, 2003.

Silicon or Silica, www.mii.org/Minerals/photosil Mar. 31, 2005.

Electronic Devices and Circuits, people.deas.harvard.edu/~jones/es154/lecture_2/materials/materials.html Mar. 31, 2005.

Data Sheet for Cymel 303ULF, www.cytec.com, no date indicated.

Data Sheet for Cycat 4040, www.cytec.com, no date indicated.

International Chemical Safety Card for p-Toluenseulfonic Acid, www.itcilo.it/english/actrav/telearn/osh/ic/104154.htm Dec. 5, 2003.

Data Sheet for p-Toluenesulfonic Acid, NIOSH Manual of Analytical Methods (NMAM), Fourth Edition, no date indicated.

Date Sheet for Dow Corning Z-6018, no date indicated.

Data Sheet for Methyl Amyl Ketone, www.arb.ca.gov/db/solvents/solvent_pages/Ketones-HTML/methyl_amyl.htm Mar. 31, 2005.

U.S. Appl. No. 11/126,946, naming Inventors Choi et al., entitled Formation of Discontinuous Films During an Imprint Lithography Process, filed May 11, 2005.

U.S. Appl. No. 11/127,041, naming Inventors Sreenivasan et al., entitled Step and Repeat Imprint Lithography Processes, filed May 11, 2005.

U.S. Appl. No. 11/127,060, naming Inventors Sreenivasan et al., entitled Step and Repeat Imprint Lithography Systems, filed May 11, 2005.

Klaus et al., SiO2 Chemical Vapor Deposition at Room Temperature Using SiCl4 and H2O with an NH3 Catalyst, J. Electrochem. Soc. 147, 2658-2664 Jan. 1, 2000.

Li et al., Exploring Low Temperature High Density Inductive Coupled Plasma Chemical Vapor Deposition (HDICPCVD) Dielectric Films for MMICs, Project Report 1002-03 for MICRO Project 02-041, no date indicated.

Plasma Enhanced Chemical Vapor Deposition (PECVD), http://yuekuo.tamu.edu/pecvd.thm, no date indicated.

Sahu et al., Influence of Hydrogen on Losses in Silicon Oxynitride Planar Optical Waveguides, Semicond. Sci. Technol. 15,pp. L11-L14 Mar. 1, 2000.

Amato-Wierda et al., Abstract of Low Temperature Chemical Vapor Deposition of Titanium Nitride Thin Films with Hydrazine and Tetrakis(dimethylamido)titanium, Electrochemical and Solid-State Ltters, vol. 2, Issue 12, pp. 613-615. Dec. 1, 1999.

Gruska et al., ICPECVD Low Temperature (less than or equal to 130 C) Deposition of $SiO_x$, $SiOxNy$ and $SiNx$ Films, 6th Israeli Conference on Plasma Science and Applications, no date indicated.

* cited by examiner

METHOD OF CONTROLLING THE CRITICAL DIMENSION OF STRUCTURES FORMED ON A SUBSTRATE

BACKGROUND OF THE INVENTION

The field of the invention relates generally to semiconductor processing. More particularly, the present invention is directed to a method of controlling the critical dimension of structures formed on a substrate.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing increased reduction of the critical dimension of the structures formed. Other areas of development in which micro-fabrication has been employed include biotechnology, optical technology, mechanical systems, and the like.

As the critical dimension of structures formed on substrates is reduced, there is an increasing desire to control the same. A method of controlling the critical dimension of semiconductor devices is described in U.S. Pat. No. 6,245,581 to Bonser et al. Bonser et al. describes a method and an apparatus for controlling critical dimensions. More specifically, a run of semiconductor devices is processed, a critical dimension measurement is performed upon at least one of the processed semiconductor devices, an analysis of the critical dimension is performed, and a second process upon the semiconductor devices in response to the critical dimension analysis is performed.

Another method of controlling the critical dimension of semiconductor devices is described in U.S. Pat. No. 5,926,690 to Toprac et al. Toprac et al. describes a control method employing a control system using photoresist etch time as a manipulated variable in either a feed-forward or a feedback control configuration to control critical dimension variation during semiconductor fabrication.

It is desired, therefore, to provide an improved method of controlling the critical dimension of structures formed on a substrate.

SUMMARY OF THE INVENTION

The present invention provides a method of patterning a substrate, the method including, inter alia, forming a multi-layered structure on the substrate formed from first, second and third materials. The first, second and third materials are exposed to an etch chemistry, with the first and second materials having a common etch rate along a first direction, defining a first etch rate, and the first and third materials having a similar etch rate along a second direction, transversely extending to the first direction, defining a second etch rate. Typically, the etch rate is selected to be different in furtherance of facilitating control of the dimensions of features formed during the etching process. These embodiments and others are described more fully below.

DETAILED DESCRIPTION OF THE INVENTION

Figure 1:
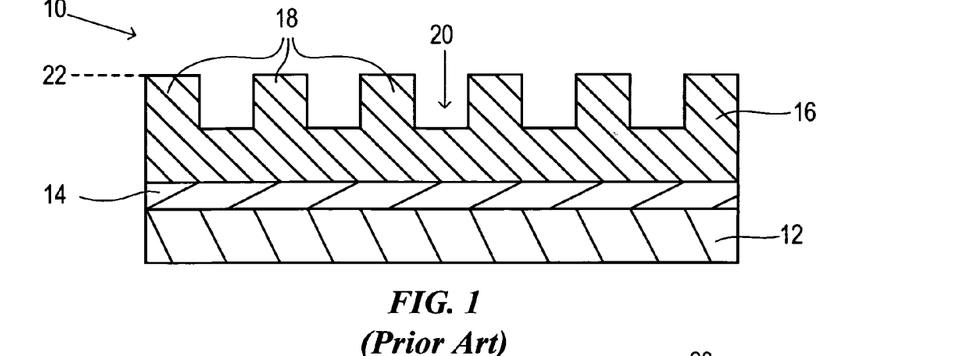
FIG. 1 is a cross-sectional view of a prior art bi-layer structure.

Referring to FIG. 1, a multi-layered structure 10 is shown. Multi-layered structure 10 comprises a substrate 12, having one or more existing layers thereon, shown as a layer 14, and a patterned layer 16. Layer 14 is disposed between substrate 12 and patterned layer 16. Substrate 12 may be formed from materials including, but not limited to, silicon, gallium arsenide, quartz, fused-silica, sapphire, organic polymers, siloxane polymers, borosilicate glass, fluorocarbon polymers or a combination thereof.

Primer layer 14 may be formed from any known material, such as aluminum, silicon nitride, a native oxide and the like. In the present example, layer 14 functions to provide a standard interface between substrate 12 and patterned layer 16, thereby reducing the need to customize each process to the material upon which patterned layer 16 is to be deposited upon. In addition, layer 14 may be formed from a material with the same etch characteristics as patterned layer 16. Layer 14 is fabricated in such a manner so as to possess a continuous, smooth, if not planar, relatively defect-free surface that may exhibit excellent adhesion to patterned layer 16. Additionally, layer 14 has a substantially uniform thickness. An exemplary composition for layer 14 is available from Brewer Science, Inc. of Rolla, Mo. under the trade name DUV30J-6. Layer 14 may be deposited upon substrate 12 using any suitable method including, but not limited to, chemical vapor deposition (CVD), physical vapor deposition (PVD), sputter deposition, spin-coating, and dispensing of a liquid.

Patterned layer 16 may comprise protrusions 18 and recessions 20 forming a pattern on a surface 22 of patterned layer 16, with recessions 20 extending along a direction parallel to protrusions 18 providing a cross-section of patterned layer 16 with a shape of a battlement. However, protrusions 18 and recessions 20 may correspond to virtually any feature required to create an integrated circuit and may be as small as a few nanometers. The pattern on surface 22 of patterned layer 16 may be formed by such techniques including, but not limited to, photolithography, e-beam lithography, x-ray lithography, ion beam lithography, and imprint lithography. Imprint lithography is described in detail in numerous publications, such as U.S. published patent application 2004/0065976, entitled, "Method and a Mold to Arrange Features on a Substrate to Replicate Features having Minimal Dimensional Variability"; 2004/0065252, entitled "Method of Forming a Layer on a Substrate to Facilitate Fabrication of Metrology Standards"; and 2004/0046271, entitled "Method and a Mold to Arrange Features on a Substrate to Replicate Features having Minimal Dimensional Variability", all of which are assigned to the assignee of the present invention. An exemplary lithographic system utilized in imprint lithography is available under the trade name IMPRIO 250™ from Molecular Imprints, Inc., having a place of business at 1807-C Braker Lane, Suite 100, Austin, Tex. 78758. The system description for the IMPRIO 250™ is available at www.molecularimprints.com and is incorporated herein by reference.

Figure 2:
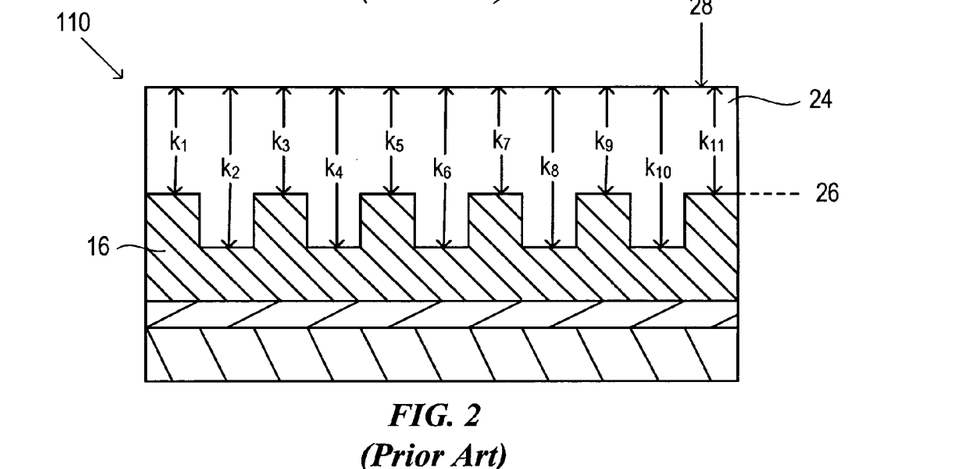
FIG. 2 is a cross-sectional view of the bi-layer structure, shown in FIG. 1, having a planarization layer disposed thereon to form a multi-layered structure.

Referring to FIG. 2, a planarization layer 24 is formed upon patterned layer 16, forming multi-layered structure 110. Planarization layer 24 may be formed upon patterned layer 16 in any of the methods mentioned above with respect to primer layer 14. In a first embodiment, planarization layer 26 may comprise an organic polymerizable resist. However, in a further embodiment, planarization layer 24 may be formed from a silicon-containing polymerizable material. Exemplary materials from which patterned layer 16 and planarization layer 24 may be formed are disclosed in U.S. patent application Ser. No. 10/789,319, entitled "Composition for an Etching Mask Comprising a Silicon-Containing Material," having Frank Xu, Michael N. Miller and Michael P. C. Watts listed as inventors and which is incorporated by reference herein. For example, patterned layer 16 may be formed from a silicon-free materials and consists of the following:

COMPOSITION 1 isobornyl acrylate n-hexyl acrylate ethylene glycol diacrylate
2-hydroxy-2-methyl-1-phenyl-propan-1-one.

In COMPOSITION 1, isobornyl acrylate comprises approximately 55% of the composition, n-hexyl acrylate comprises approximately 27%, ethylene glycol diacrylate comprises approximately 15% and the initiator 2-hydroxy-2-methyl-1-phenyl-propan-1-one comprises approximately 3%. The initiator is sold under the trade name DAROCUR® 1173 by CIBA® of Tarrytown, N.Y. The above-identified composition also includes stabilizers that are well known in the chemical art to increase the operational life of the composition.

Release properties of COMPOSITION 1 may be improved by including a surfactant. For purposes of this invention a surfactant is defined as any molecule, one tail of which is hydrophobic. Surfactants may be either fluorine containing, e.g., include a fluorine chain, or may not include any fluorine in the surfactant molecule structure. An exemplary surfactant is available under the trade name ZONYL® FSO-100 from DUPONT that has a general structure of $R_1R_2$ where $R_1=F(CF_2CF_2)_y$, with y being in a range of 1 to 7, inclusive and $R_2=CH_2CH_2O(CH_2CH_2O)_xH$, where X is in a range of 0 to 15, inclusive. This provides material 40 with the following composition:

COMPOSITION 2 isobornyl acrylate n-hexyl acrylate ethylene glycol diacrylate 2-hydroxy-2-methyl-1-phenyl-propan-1-one $R_fCH_2CH_2O(CH_2CH_2O)_xH$, The ZONYL® FSO-100 additive comprises less than 1% of the composition, with the relative amounts of the remaining components being as discussed above with respect to COMPOSITION 1. However, the percentage of ZONYL® FSO-100 may be greater than 1%.

Planarization layer 24 may be formed from a silicon-containing material that is suitable for deposition upon patterned layer 16 employing spin-coating technique. Exemplary compositions from which to form planarization layer 24 are as follows:

COMPOSITION 3 hydroxyl-functional polysiloxane
hexamethoxymethylmelamine toluenesulfonic acid
methyl amyl ketone

COMPOSITION 4 hydroxyl-functional polysiloxane
hexamethoxymethylmelamine
gamma-glycidoxypropyltrimethoxysilane
toluenesulfonic acid methyl amyl ketone In COMPOSITION 3, hydroxyl-functional polysiloxane comprises approximately 4% of the composition, hexamethoxymethylmelamine comprises approximately 0.95%, toluenesulfonic acid comprises approximately 0.05% and methyl amyl ketone comprises approximately 95%. In COMPOSITION 4, hydroxyl-functional polysiloxane comprises approximately 4% of the composition, hexamethoxymethylmelamine comprises approximately 0.7%, gamma-glycidoxypropyltrimethoxysilane comprises approximately 0.25%, toluenesulfonic acid comprises approximately 0.05%, and methyl amyl ketone comprises approximately 95%.

Both COMPOSITIONS 3 and 4 are made up of at least 4% of the silicone resin. Upon curing, however, the quantity of silicon present in conformal layer 58 is at least 5% by weight and typically in a range of 20% or greater. Specifically, the quantity and composition of the solvent present in COMPOSITIONS 3 and 4 is selected so that a substantial portion of the solvent evaporates during spin-coating application of the COMPOSITION 3 or 4 on solidified imprinting layer 134. In the present exemplary silicon-containing material, approximately 90% of the solvent evaporates during spin-coating. Upon exposing the silicon-containing material to thermal energy, the remaining 10% of the solvent evaporates, leaving conformal layer 58 with approximately 20% silicon by weight.

Referring to FIGS. 1 and 2, planarization layer 24 includes first and second opposed sides. First side 26 faces patterned layer 16 and has a profile complementary to the profile of patterned layer 16. Second side 28 faces away from patterned layer 16. As shown in FIG. 2, second side 28 has a substantially normalized profile. To provide second side 28 with a substantially normalized profile, distances $k_1$, $k_3$, $k_5$, $k_7$, $k_9$, and $k_{11}$ between protrusions 18 and second side 28 are substantially the same and the distances $k_2$, $k_4$, $k_6$, $k_8$, and $k_{10}$ between recessions 20 and second side 28 are substantially the same. One manner in which to provide second side 28 with a normalized profile is to contact planarization layer 24 with a planarizing mold (not shown) having a smooth, if not planar, surface. Planarization layer 24 is exposed to actinic energy to polymerize and, therefore, to solidify the same. Exemplary actinic energy includes ultraviolet, thermal, electromagnetic, visible light, heat, and the like. The selection of actinic energy depends on the materials from which planarization layer 24 is formed. After solidification of planarization layer, planarizing mold (not shown) is separated therefrom. To ensure that planarization layer 24 does not adhere to the planarizing mold (not shown), a low surface energy coating, such as a diamond-like layer, may be deposited upon the planarizing mold (not shown) or the planarization mold (not shown) may be formed from a material having a low surface energy, e.g., diamond. Alternatively, release properties of planarization layer 24 may be improved by including in the material from which the same is fabricated the aforementioned surfactant. The surfactant provides the desired release properties to reduce adherence of planarization layer 24 to the planarizing mold (not shown). It should be understood that the surfactant may be used in conjunction with, or in lieu of, the low surface energy coating that may be applied to the planarizing mold (not shown).

Figure 3:
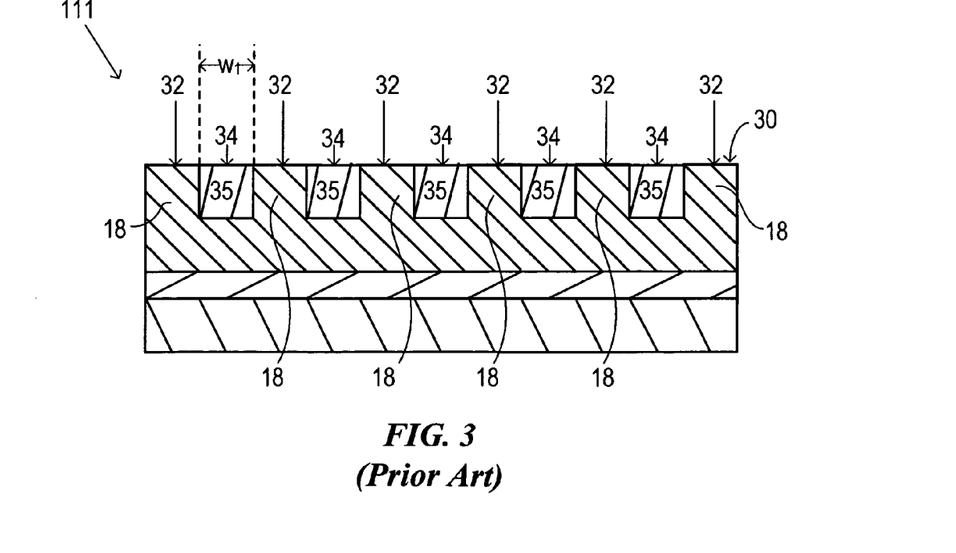
FIG. 3 is a cross-sectional view of the multi-layered structure, shown in FIG. 2, after being subjected to a blanket etch, forming etched structure, in accordance with the prior art.

Referring to FIGS. 2 and 3, multi-layered structure 110 is subjected to an isotropic or anisotropic etch to remove portions of planarization layer 24 to provide multi-layered structure 110 with a crown surface 30 of etched structure 111. Crown surface 30 is defined by an exposed surface 32 of each of protrusions 18 and surface 34 of areas 35 of planarization layer 24 that remain after certain etch processes. Surfaces 34 have a width '$w_1$'.

Figure 4:
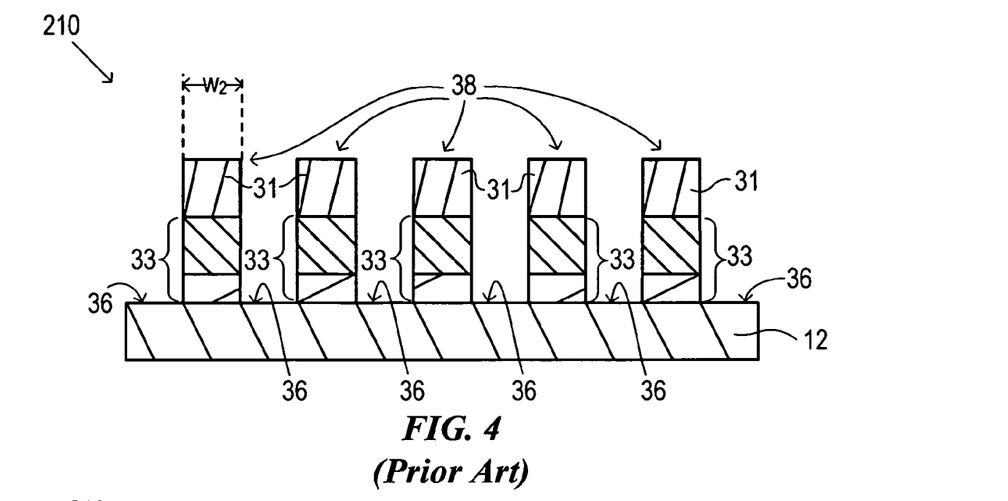
FIG. 4 is a cross-sectional view of the etched structure, shown in FIG. 3, after being subjected to an anisotropic etch process, in accordance with the prior art.

Referring to FIGS. 3 and 4, etched structure 111 is subjected to an anisotropic etch. The etch chemistry of the anisotropic etch is selected to maximize etching of protrusions 18 and the segments of patterned layer 16 in superimposition therewith, while minimizing etching of the areas 35. As a result, regions 36 of substrate 12 in superimposition with protrusions 18 are exposed forming a multi-layered structure 210. Multi-layered structure 210 comprises protrusions 38, each of which has an upper region 31 and a nadir region 33. Upper region 31 is fabricated from portions of areas 35 that remain. Nadir regions 33 comprise patterned layer 16 and primer layer 14 in superimposition with areas 35. Protrusions 38 have a width '$w_2$'. Ideally, width '$w_2$' is substantially the same as width '$w_1$' of portions 34.

Figure 5:
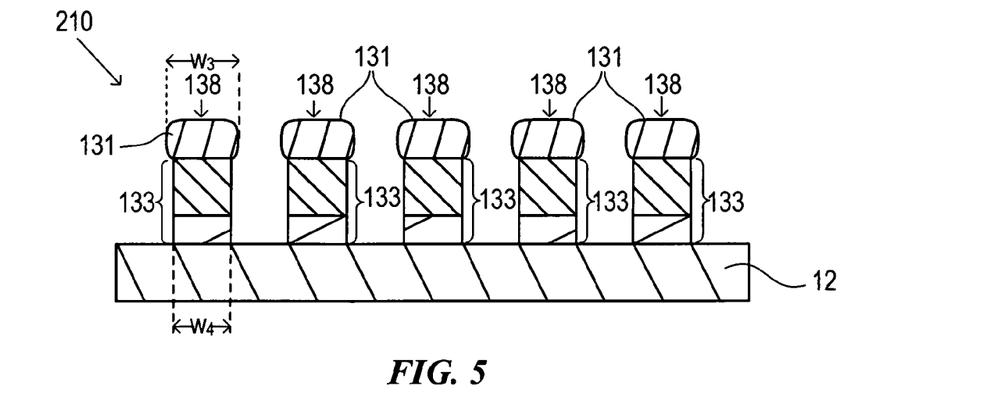
FIG. 5 is a cross-sectional view of the etched structure, shown in FIG. 3, demonstrating critical-dimension control characteristics that were recognized and attenuated, in accordance with the present invention.

Referring to FIGS. 4 and 5, obtaining ideal dimensions of widths $w_1$ and $w_2$ is often problematic. For example, it has often been found that upper region 131 has a width '$w_3$' that differs from the width '$w_4$' of nadir region 133. As shown in FIG. 5, width '$w_3$' is greater than width '$w_4$,' however; width '$w_3$' may be smaller than width '$w_4$'. The variation of width '$w_3$' as compared to width '$w_4$' may be as a result of subjecting crown surface 30, shown in FIG. 3, to the aforementioned anisotropic etch. The difference in width may be due to any one or more of several factors, including swelling of upper region 131 in response to the etch chemistry employed to form protrusions 138. Alternatively, or in addition to the aforementioned swelling, undercutting, and/or sputtering of nadir region 133 may occur during formation of protrusions 138. Nonetheless, it is desired to have width '$w_3$' be substantially the same as width '$w_4$,' and thus, width '$w_3$' substantially the same as width '$w_1$,' shown in FIG. 3. To that end, a liner layer is employed to substantially surround exposed sides of the segments of upper region 131. A liner layer for purposes of the present invention is to be defined as a layer that substantially conforms to the shape of the surface upon which it is disposed and substantially insulates the material from desired processes. Typically, the liner layer is thinner than the layer upon which it is disposed.

Figure 6:
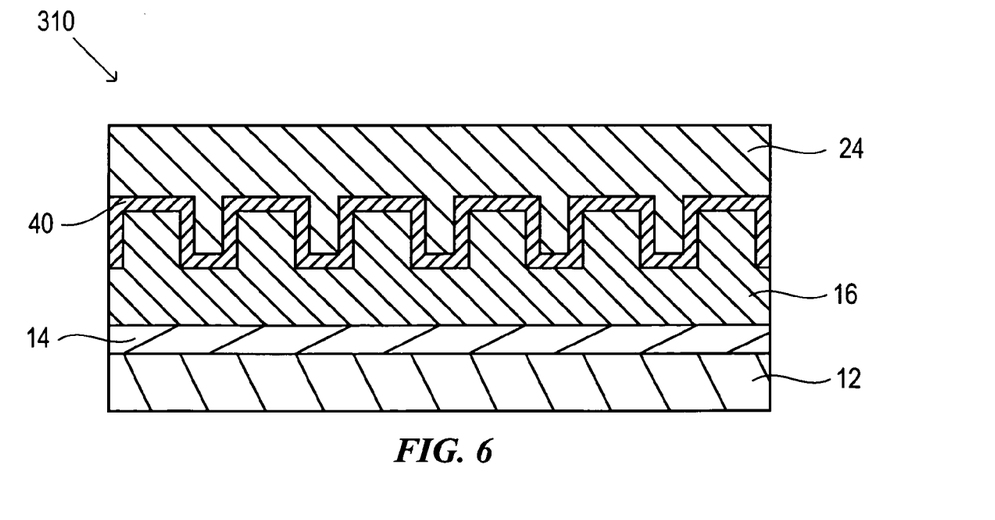
FIG. 6 is a cross-sectional view of a multi-layered structure formed in accordance with the present invention.

Referring to FIG. 6, a liner layer 40 is formed so that same may be present between patterned layer 16 and planarization layer 24, forming multi-layered structure 310. To that end, liner layer 40 is deposited on patterned layer 16. An exemplary liner layer 40 would have a relative thickness and etch rate differential, compared to patterned layer 16 and/or planarization layer 24, which enables formation of a desired pattern in primer layer 14 and/or substrate 12. Typically, the pattern formed therein corresponds to the pattern in patterned layer 16. In the present example, liner layer 40 has a thickness in a range of 5 nm to 100 nm, inclusive and provides an etch rate differential of no less than 10:1. For example, the etch rate of the liner layer 40, for a given etch chemistry, may be ten times faster than the etch rate of patterned layer 16 and/or planarization layer 24. Alternatively, the etch rate of liner layer 40, for a given etch chemistry, may be ten times slower than the etch rate of patterned layer 16 and/or planarization layer 24. In this manner, liner layer 40 functions as a hard mask. To that end, exemplary material from which to form liner layer 40 includes silicon dioxide ($SiO_2$), silicon nitride (SiN) and silicon oxynitride (SiON). It is desired that liner layer 40 be formed from processes that would not compromise the structural integrity of patterned layer 16 and/or planarization layer 24. For example, were patterned layer 16 formed from COMPOSITION 1 or COMPOSITION 2, it would be desired that the process employed to deposit liner layer 40 employs temperatures no greater than 150 degrees Celsius. An exemplary process by which to deposit liner layer 40 formed from $SiO_2$ is discussed by J. W. Klaus and S. M. George in the article entitled "$SiO_2$ Chemical Vapor Deposition at Room Temperatures Using $SiCl_4$ and $H_2O$ with an $NH_3$ Catalyst," Journal of the Electrochemical Society, 147 (7) 2658-2664 (2000). An exemplary process by which to deposit liner layer 40 formed from SiN is discussed by G. P. Li and Human Guan in an article entitled "Exploring Low Temperature High Density Inductive Coupled Plasma Chemical Vapor Deposition (HDICPCVD) Dielectric Films for MMICs," project Report 2002-03 for MICRO Project 02-241, Department of Electrical & Computer Engineering, University of California, Irvine, Calif. After formation of liner layer 40, planarization layer 24 is disposed atop thereof, as discussed above.

Figure 7:
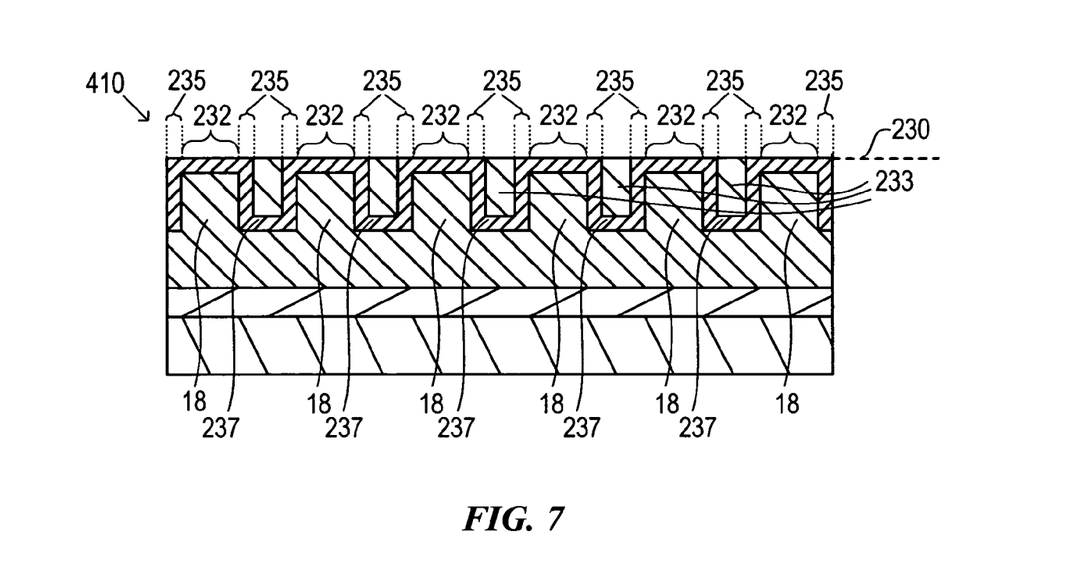
FIG. 7 is a cross-sectional view of the multi-layered structure, shown in FIG. 6, after being subjected to a blanket etch process, in accordance with the present invention.

Referring to FIGS. 6 and 7, multi-layered structure 310 is subjected to an etch process to remove portions of planarization layer 24 to provide a multi-layered structure 410 with a crown surface 230, wherein the isotropic etch may be an $O_2$ etch. To that end, multi-layered structure 310 may be deposited in an inductively coupled plasma etch reactor 330, shown in FIG. 8.

Figure 8:
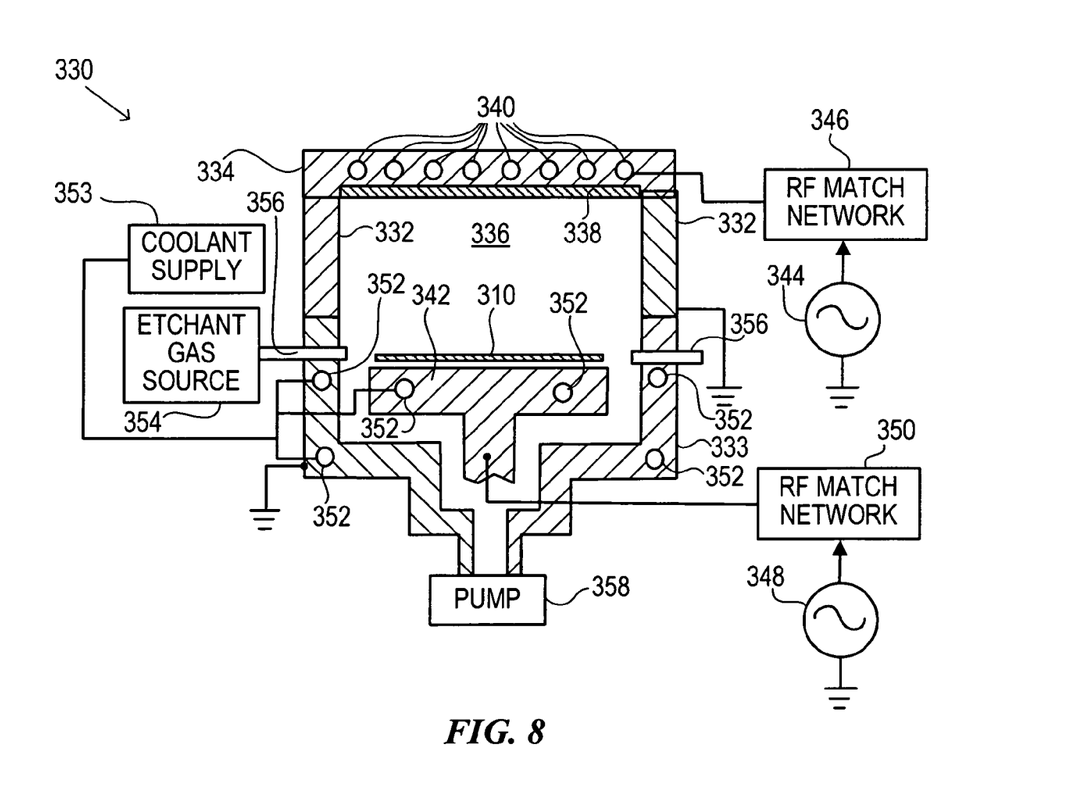
FIG. 8 is a simplified plan view of an etch chamber that may be employed to practice the present invention.

Referring to FIG. 8, reactor 330 includes upper 332 and lower 333 bodies and a cover 334, which defines a chamber 336. Cover 334 includes a dielectric window 338 and a coil 340 disposed proximate to dielectric window 338. Multi-layered structure 310 is supported within chamber 336 by a pedestal 342 or chuck, with dielectric window 338 disposed between structure 310 and coil 340. Coil 334 typically includes multiple windings and is connected to a radio frequency (RF) power generator 344 through an impedance matching network 346 to provide RF power into chamber 336. In addition, a bias RF power generator 348 and associated impedance matching circuit 350 is connected to pedestal 342 and used to impose a bias on multi-layer structure 310. Upper body 332 is composed of dielectric material, typically quartz or ceramic, so as to minimize attenuation of the RF power coupled into chamber 336. Lower body 333 surrounds pedestal 342 and is formed from electrically conductive material. Lower body 333 coupled to ground functions as the ground for the RF power supplied to pedestal 342. Also included are cooling channels 352 formed within the lower body 333 and pedestal 342. A supply of coolant fluid 353 may be pumped through channels 352 to transfer heat away from the interior of chamber 336 and/or pedestal 342 to control the temperature thereof. The temperature of upper body 332 may be controlled by forced air convection/conduction methods. A source 354 of etchant gases is in fluid communication with chamber 336 through gas injection ports 356. A vacuum pump 358 is in fluid communication with chamber 336 to control the pressure of the atmosphere therein. An exemplary reactor that may be employed is available from Oxford Instruments America, Inc. 130 Baker Avenue, Concord, Mass. 01742 under the product name PLASMALAB 80 PLUS.

Referring to FIGS. 6, 7 and 8, assuming planarization layer 24 is formed from one of COMPOSITIONS 3 and 4, crown surface 230 is formed by exposing multi-layered structure 310 to an etch chemistry that includes oxygen flowed into chamber 336 at a rate of approximately 30 standard cubic centimeters per minute (sccm), $CHF_3$ flowed into chamber 336 at a rate of approximately 12 sccm. RF power 344 is established to be at 45 Watts at 13.56 MHz, and DC bias 350 is set at −185 volts. Pump 358 establishes a chamber pressure of approximately 20 Torr, and pedestal 342 is maintained at a temperature of approximately −8° C. With these parameters, crown surface 230 is formed in approximately 4 minutes and 40 seconds. Were planarization layer formed from one of COMPOSITIONS 1 and 2, i.e., without any silicon being present, the same etch parameters mentioned above may be employed excepting that $CHF_3$ is not introduced into chamber 336.

As a result of etching planarization layer 24, crown surface 230 is defined by exposed regions of liner layer 40 and regions 233 that remain of planarization layer 24 after being exposed to the isotropic $O_2$ etch. Exposed regions of liner layer 40 include surfaces of first portions 232, which are in superimposition with protrusions 18 and surfaces of second portions 235. Second portions 235 are disposed on opposed ends of first portion 232 and in superimposition with recession 20. Extending between subsets of adjacent second portions 235 are nadir portions 237.

Figure 9:
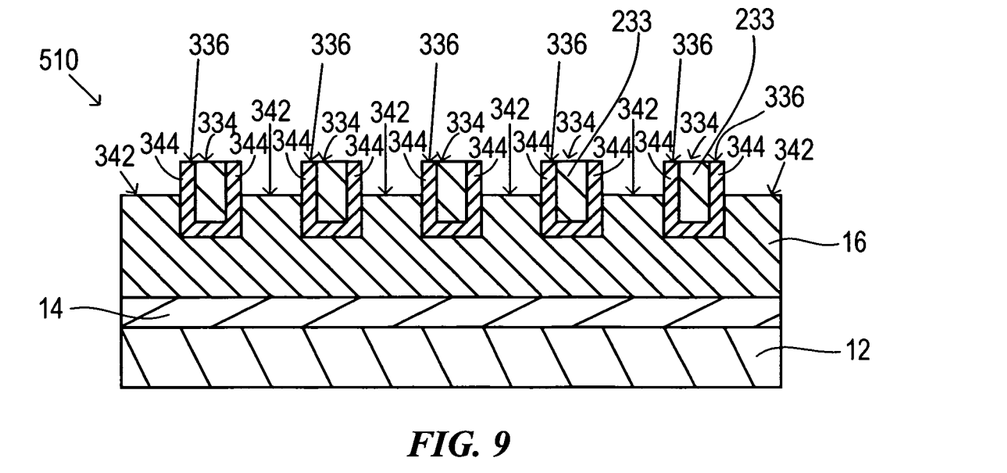
FIG. 9 cross-sectional view of the multi-layered structure, shown in FIG. 7, after being subjected to an anisotropic etch process, in accordance with the prior art.

Referring to FIGS. 7-9, an anisotropic etch is employed to substantially remove first portion 232 and surfaces of second portions 235. To that end, multi-layered structure 410 is subjected to an etching environment in chamber 336 by establishing RF power 344 to be approximately 50 Watts at 13.56 MHz, DC bias 350 to be approximately −196 volts, chamber pressure at approximately 30 Torr, with the oxygen flow being terminated. Pedestal 342 is maintained at a temperature of approximately −8° C. With these parameters a multi-layered structure 510 having a surface with a shape of a battlement is formed by exposure of multi-layered structure 410 to this etching environment for approximately 1 minute and ten seconds. The battlement surface is defined by exposed surfaces 342 in regions of patterned layer 16 that were in superimposition with protrusions 18, as well as surfaces 334 of remaining portions of regions 233 and surfaces 336 of the remaining areas of second portions 235. An extent of second portions 235, extending between surface 336 and surface 342 define sidewalls 344.

Figure 10:
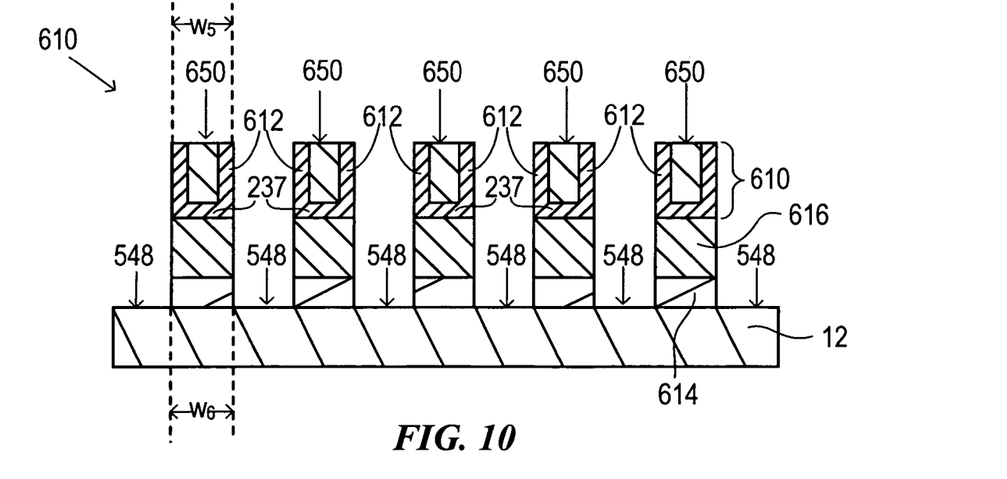
FIG. 10 is a cross-sectional view of the multi-layered structure, shown in FIG. 9, after subjecting the same to etch processes to expose areas of the underlying substrate.

Referring to FIGS. 9 and 10, an anisotropic etch is employed to remove portions of multi-layered structure 510 in superimposition with exposed surfaces 342, forming multi-layered structure 610. To that end, multi-layered structure 510 is subjected to an etching environment in chamber 336 by establishing RF power 344 to be approximately 130 Watts at 13.56 MHz, DC bias 350 to be approximately −380 volts, chamber pressure at approximately 6 Torr, with the $CHF_3$ being replaced by a flow of argon and oxygen. The argon is flowed into chamber 336 at a rate of approximately 30 sccm and the oxygen at a rate of approximately 3 sccm. Pedestal 342 is maintained at a temperature of approximately −8° C. With these parameters a multi-layered structure 610 is formed by exposure of multi-layered structure 510 to this etching environment for approximately 6 minutes. More specifically, portions of primer layer 14 and patterned layer 16 in superimposition with exposed surfaces 342 are removed. As a result, areas 548 of substrate 12 in superimposition with exposed surfaces 342 are exposed, leaving spaced-apart protrusions 650. Each protrusion 650 includes a sub-portion 614 of planarization layer 14, a sub-portion 616 of patterned layer 16 and an upper portion 610. Upper portion 610 includes a sub-portion 612 of sidewall 344, nadir portion 237 and the remaining portions of region 233 in superimposition with nadir portion 237. A width '$w_5$' of upper portion 610 is substantially equal to a width '$w_6$' of lower portion. Specifically, sub-portions 612 ensures that width '$w_5$' is substantially the same as width '$w_6$,' as desired. In this manner, width '$w_5$' and, therefore, width '$w_6$' may be substantially the same as width '$w_1$,' shown in FIG. 3.

In a further embodiment, planarization layer 24 may be formed from a silicon-containing polymerizable material. More specifically, planarization layer 24 may be formed from a silicon-containing spin-on material. Therefore, the aforementioned isotropic etch to remove portions of planarization layer 24 to provide multi-layered structure 410 may be a halogen etch. Also, multi-layered structure 610 may be utilized in a lift-off process.

The embodiments of the present invention described above are exemplary. Many changes and modification may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A method of patterning a substrate, said method comprising:

forming a multi-layered structure on said substrate by positioning on said substrate, a patterned layer having a coating disposed thereon, said patterned layer having a plurality of protrusions and recessions, and forming upon said coating, a planarization layer, with said multi-layered structure having a crown surface facing away from said substrate; and selectively removing portions of said multi-layered structure in superimposition with said protrusions to form a plurality of projections on said substrate with portions of said planarization layer forming a mask in areas of said crown surface in superimposition with said recessions, said projections comprising a first layer having a first width associated therewith and a second layer having a second width associated therewith, said first layer comprising portions of said coating defining a pair of spaced-apart sidewalls and a nadir portion extending therebetween having portions of said planarization layer in superimposition with said nadir portion and positioned between said sidewalls, with said sidewalls defining said first width such that said first width is substantially the same as said second width.

2. The method as recited in claim 1 further includes disposing a primer layer between said substrate and said patterned layer.

3. The method as recited in claim 1 wherein selectively removing portions of said multi-layered structure further includes defining a first interface of said coating and said planarization layer and a second interface of said coating and said patterned layer.

4. The method as recited in claim 1 wherein said projection has a width defined by a width of said recession of said patterned layer.

5. The method as recited in claim 1 wherein said crown surface includes exposed regions of said coating spaced-apart by exposed regions of said planarization layer disposed between adjacent exposed regions of said coating.

6. The method as recited in claim 1 wherein selectively removing portions of said multi-layered structure further comprises exposing said multi-layered structure to an etch chemistry, with said coating and said planarization layer having a common etch rate along a first direction, defining a first etch rate, and said coating and patterned layer having a similar etch rate along a second direction, transversely extending to said first direction, defining a second etch rate.

7. The method as recited in claim 6 wherein said first rate differs from said second etch rate.

8. The method as recited in claim 6 wherein said first etch rate is less than said second etch rate.

9. The method as recited in claim 6 wherein said first etch rate is greater than said second etch rate.

10. The method as recited in claim 6 wherein exposing further includes concurrently exposing said patterned layer, said coating, and said planarization layer to said etch chemistry.

11. A method of patterning a substrate, said method comprising:
    disposing upon said substrate a patterned layer formed from a first material and having a pair of spaced-apart protrusions with a recession formed therebetween, said recession having a width;
    forming upon said patterned layer, a liner layer formed from a second material, a portion of which covers said recession;
    forming upon said liner layer, a planarization layer, formed from a third material, with said substrate, patterned layer, liner layer, and planarization layer defining a multi-layered structure having a crown surface facing away from said substrate; and
    exposing said first, second and third materials to multiple etching processes to remove, selectively, portions of said first, second and third materials in superimposition with said protrusions to generate a projection on said substrate with portions of said planarization layer forming a mask in areas of said crown surface in superimposition with said recession, with said projection having a layer comprising portions of said coating defining a pair of spaced-apart sidewalls and a nadir portion extending therebetween having portions of said planarization layer in superimposition with said nadir portion and positioned between said sidewalls, with said sidewalls defining a width of said projection to be substantially the same as said width of said recession.

12. The method as recited in claim 11 wherein exposing further includes concurrently exposing said first, second and third materials to a common etch chemistry, with said second and third materials having a common etch rate along a first direction to said common etch chemistry, defining a first etch rate, and said first and second materials having a similar etch rate along a second direction to said common etch chemistry, with said second direction being transverse to said first direction, defining a second etch rate, with said second etch rate differing from said first etch rate.

13. The method as recited in claim 11 further including disposing a primer layer between said substrate and said patterned layer.

14. The method as recited in claim 11 wherein said crown surface includes exposed regions of said liner layer spaced-apart by exposed regions of said planarization layer located between adjacent exposed regions of said liner layer.

15. The method as recited in claim 11 wherein exposing further comprises said projection being in superimposition with said recession.

16. A method of patterning a substrate, said method comprising:
    creating a multi-layered structure by forming on said substrate, a patterned layer having a coating disposed thereon, said patterned layer having a plurality of protrusions and recessions, and forming up on said coating, a planarization layer, with said multi-layered structure having a crown surface facing away from said substrate; and
    selectively removing portions of said multi-layered structure in superimposition with said protrusions to form a plurality of projections on said substrate with portions of said planarization layer forming a mask in areas of said crown surface in superimposition with said recessions, said projections comprising a first layer having a first width associated therewith and a second layer having a second width associated therewith, said first layer comprising a pair of spaced-apart sidewalls having portions of said planarization layer disposed therebetween, with said sidewalls establishing said first width such that said first width is substantially the same as said second width.

17. The method as recited in claim 16 wherein selectively removing said portions further includes exposing a plurality of regions of said substrate in superimposition with said protrusions.

18. The method as recited in claim 16 wherein selectively removing portions further comprises said plurality of projections being in superimposition with said plurality of recessions.

19. The method as recited in claim 17 wherein said method further includes having a region of said plurality of regions being disposed between adjacent projections of said plurality of projections.

20. The method as recited in claim 19 wherein said method further includes selectively removing portions of said coating in superimposition with said protrusions to expose an apex of said plurality of protrusions.

21. The method as recited in claim 20 further including forming a primer layer between said patterned layer and said substrate.

22. The method as recited in claim 21 wherein said plurality of recessions have a third width associated therewith, with said sidewalls further establishing said first width such that said first width is substantially the same as said third width.

23. The method as recited in claim 22 wherein said method further includes forming said planarization layer from a material selected from the group consisting of a silicon-containing polymerizable material and an organic polymerizable resist.

* * * * *